United States Patent
Kim et al.

(10) Patent No.: US 9,859,023 B2
(45) Date of Patent: Jan. 2, 2018

(54) MEMORY TEST SYSTEM AND METHOD OF TESTING MEMORY DEVICE

(71) Applicant: Samsung Electronics Co., Ltd., Suwon-si (KR)

(72) Inventors: Dong-Wook Kim, Hwaseong-si (KR); Jae-Hong Kim, Seoul (KR); Jun-Ki Jeong, Cheonan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/176,618

(22) Filed: Jun. 8, 2016

(65) Prior Publication Data

US 2017/0062074 A1    Mar. 2, 2017

(30) Foreign Application Priority Data

Aug. 24, 2015    (KR) .................. 10-2015-0118558

(51) Int. Cl.
    *G11C 29/56*    (2006.01)
    *G11C 29/26*    (2006.01)
    *G11C 29/18*    (2006.01)

(52) U.S. Cl.
    CPC ........ *G11C 29/56008* (2013.01); *G11C 29/26* (2013.01); *G11C 2029/1802* (2013.01); *G11C 2029/2602* (2013.01); *G11C 2029/5604* (2013.01)

(58) Field of Classification Search
    CPC ...... G11C 29/08; G11C 7/10; G11C 29/56008
    USPC ........................................ 365/201
    See application file for complete search history.

(56) References Cited

U.S. PATENT DOCUMENTS

| | | | |
|---|---|---|---|
| 6,249,533 B1 | 6/2001 | Goishi | |
| 7,426,663 B2 | 9/2008 | Takazawa et al. | |
| 7,512,001 B2 | 3/2009 | Kwon et al. | |
| 7,539,910 B2 | 5/2009 | Ahn et al. | |
| 8,473,694 B2 | 6/2013 | Lee et al. | |
| 2003/0191993 A1* | 10/2003 | Miwa | G11C 29/18 714/718 |
| 2004/0153910 A1* | 8/2004 | Thalmann | G11C 29/14 714/717 |
| 2008/0235539 A1* | 9/2008 | Yamada | G01R 31/31919 714/703 |
| 2013/0117617 A1 | 5/2013 | Oh | |

(Continued)

FOREIGN PATENT DOCUMENTS

KR    2013-0129703 A    11/2013

*Primary Examiner* — Huan Hoang
*Assistant Examiner* — Muna A Techane
(74) *Attorney, Agent, or Firm* — Muir Patent Law, PLLC

(57) ABSTRACT

A memory test system may include a tester and N memory devices, where N is a positive integer greater than 1. The tester may generate test signals. A K-th memory device of the N memory devices includes a plurality of K-th memory banks and a K-th decoder, where K is each positive integer equal to or smaller than N. The K-th memory banks may be configured to operate based on first internal signals and each of the K-th memory banks includes a plurality of unit blocks. The K-th decoder may be configured to convert the test signals corresponding to the first test to the first internal signals based on a K-th conversion relation and update the K-th conversion relation based on a result of the first test with respect to the K-th memory device.

20 Claims, 15 Drawing Sheets

(56) References Cited

U.S. PATENT DOCUMENTS

2013/0170274 A1* 7/2013 Yu ................... G11C 11/4063
                                                              365/51
2014/0245088 A1    8/2014  Torrecampo
2015/0106551 A1    4/2015  Kim et al.

* cited by examiner

NTH=5

NTH=5

FIG. 6

| ADDR_BANK | AINT1_BANK | ERROR UB IN BANK 1 | AINT2_BANK | ERROR UB IN BANK 2 | ... | AINTN_BANK | ERROR UB IN BANK N |
|---|---|---|---|---|---|---|---|
| 00 | 00 | ○ | 00 | × | ... | 00 | × |
| 01 | 01 | × | 01 | × | ... | 01 | ○ |
| 10 | 10 | × | 10 | × | ... | 10 | × |
| 11 | 11 | × | 11 | ○ | ... | 11 | × |

SET DTR1 AS 0001    SET DTR2 AS 1000    SET DTRN AS 0010

@ DTR1=0000, DTR2=0000, DTRN=0000

| DTR1 | DTR2 | ... | DTRN | | ADDR_BANK | AINT1_BANK | AINT2_BANK | ... | AINTN_BANK |
|---|---|---|---|---|---|---|---|---|---|
| 0000 | 0000 | ... | 0000 | CASE1 | 00 | 00 | 00 | ... | 00 |
|  |  |  |  |  | 01 | 01 | 01 | ... | 01 |
|  |  |  |  |  | 10 | 10 | 10 | ... | 10 |
|  |  |  |  |  | 11 | 11 | 11 | ... | 11 |
| 0001 | 1000 | ... | 0010 | CASE2 | 00 | 00 | <u>11</u> | ... | <u>01</u> |
|  |  |  |  |  | 01 | 01 | 01 | ... | <u>00</u> |
|  |  |  |  |  | 10 | 10 | 10 | ... | 10 |
|  |  |  |  |  | 11 | 11 | <u>00</u> | ... | 11 |

FIG. 8

@ DTR1=0001, DTR2=1000, ..., DTRN=0010

| ADDR_BANK | AINT1_BANK | ERROR UB IN BANK 1 | AINT2_BANK | ERROR UB IN BANK 2 | ... | AINTN_BANK | ERROR UB IN BANK N |
|---|---|---|---|---|---|---|---|
| 00 | 00 | ○ | 11 | ○ | ... | 01 | ○ |
| 01 | 01 | × | 01 | × | ... | 00 | × |
| 10 | 10 | × | 10 | × | ... | 10 | × |
| 11 | 11 | × | 00 | × | ... | 11 | × |

| MEMORY DEVICE | # OF FAILED UBS |
|---|---|
| 1 | 200 |
| 2 | 8 |
| ⋮ | ⋮ |
| N | 0 |

} SET PPRR1 AS 1
} SET PPRR2 AS 0
} SET PPRRN AS 0

NLIMIT=100

FIG. 13

| PPRRK | CMD | ESK |
|---|---|---|
| 0 | ⋮ | ⋮ |
|  | PPR | 1 |
|  | ⋮ | ⋮ |
| 1 | ⋮ | ⋮ |
|  | PPR | 0 |
|  | ⋮ | ⋮ |

MEMORY TEST SYSTEM AND METHOD OF TESTING MEMORY DEVICE

CROSS-REFERENCE TO RELATED APPLICATION

This U.S. Non-provisional application claims priority under 35 USC §119 to Korean Patent Application No. 10-2015-0118558, filed on Aug. 24, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a memory test system and a memory system to perform a test efficiently.

2. Discussion of the Related Art

As memory capacity of a memory device increases, a test time for detecting failed memory cells in the memory device typically increases. Since the increased the test time raises cost of the memory device, it is desired to find a method of reducing the test time.

If a large number of failed memory cells are found in a stage of post-package recovery (PPR), there is a high probability that the errors may be due to a problem in a tester that performs the test with respect to the memory device. In this case, the good memory cells may be determined to be the bad memory cells. Repair resources such as replaced memory cells may be exhausted in the PPR stage and thus the memory cells that are defective in a normal use after the PPR stage cannot be repaired.

SUMMARY

At least one example embodiment of the present disclosure may provide a memory test system capable of updating or adjusting a conversion relation of a decoder based on a test result so that an additional test may be performed in parallel with respect to a plurality of memory devices.

At least one example embodiment of the present disclosure may provide a memory system capable of operating in a test mode by updating or adjusting a conversion relation of a decoder based on a test result so that an additional test may be performed in parallel with respect to a plurality of memory devices.

According to example embodiments, a memory test system includes a tester and N memory devices, where N is a positive integer greater than 1. The tester generates test signals for testing a memory device. A K-th memory device of the N memory devices includes a plurality of K-th memory banks and a K-th decoder, where K is each positive integer equal to or smaller than N. The K-th memory banks operate based on first internal signals and each of the K-th memory banks includes a plurality of unit blocks. The K-th decoder is configured to convert the test signals corresponding to the first test to the first internal signals based on a K-th conversion relation, update the K-th conversion relation based on a result of the first test with respect to the K-th memory device, and convert the test signals corresponding to a second test to second internal signals based on the updated K-th conversion relation.

The first through N-th decoders may update the first through N-th conversion relations respectively such that a second test for the N memory devices may be performed in parallel, based on the first through N-th update conversion relations, with respect to the memory banks that are determined through the first test to have errors.

The tester may generate the test signals corresponding to a second test after the first test is finished and the K-th memory device may perform the second test based on the K-th updated conversion relation.

Each unit block may include a plurality of memory cells and the second test may be an additional test with respect to the unit block including a greater number of failed memory cells than a reference number.

The first through N-th decoders may update the first through N-th conversion relations respectively such that the second test may be performed in parallel, based on the first through N-th updated conversion relations, with respect to the memory banks including the failed unit block and included in the different memory devices.

The result of the first test may include first through N-th sub-test results respectively corresponding to the first through N-th memory devices. At least one bit of the K-th sub-test result may have a first logic value when the K-th memory banks include a failed unit block and all bits of the K-th sub-test result may have a second logic value when the K-th memory banks do not include a failed unit block.

When all bits of the first through N-th sub-test results have the second logic value, the K-th decoder may maintain the K-th conversion relation without updating such that a test address signal in the test signals may be output as a K-th internal address signal in the K-th internal signals.

When at least two of the first through N-th sub-test results include at least one bit of the first logic value, the K-th decoder may adjust the K-th conversion relation between the test address signal and the K-th internal address signal such that a second test may be performed in parallel, based on the first through N-th updated conversion relations, with respect to the memory banks including the failed unit block and included in the different memory devices.

The K-th decoder may include a K-th register configured to store the K-th sub test result.

The first through N-th decoders may update the first through N-th conversion relations during the first test such that a repair command may not be transferred to the memory device that includes a greater number of failed unit blocks than a reference number.

The result of the first test may include first through N-th sub-test results respectively corresponding to the first through N-th memory devices. The K-th sub-test result may have a first logic value when a number of the failed unit blocks in the K-th memory banks is equal to or greater than a threshold number, and the K-th sub-test result may have a second logic value when a number of the failed unit blocks in the K-th memory banks is smaller than the threshold number.

The K-th memory device may further include K-th repair memory block. The K-th decoder may include a K-th register configured to store the K-th sub-test result.

When the K-th sub-test result has the second logic value, the K-th memory device may adjust the K-th conversion relation such that a K-th bank enable signal included in the K-th internal signals may be activated based on a repair command signal included in the test signals, and the K-th memory device may repair the failed unit blocks in the K-th memory banks by replacing the failed unit blocks with the repair memory block.

When the K-th sub-test result has the first logic value, the K-th memory device may adjust the K-th conversion relation such that the K-th bank enable signal may be deactivated regardless of the repair command signal, and the K-th memory device may not repair the failed unit blocks.

According to example embodiments, a memory system includes a processor and a memory module. The processor generates control signals in a normal operation mode and test signals corresponding to a test in a test mode. The memory module may include first through N-th memory devices controlled by the control signals and the test signals, where N is a positive integer greater than 1. A K-th memory device of the first through N-th memory devices includes a plurality of K-th memory banks and a K-th decoder, where K is a positive integer equal to or smaller than N. The K-th memory banks operate based on K-th internal signals and each of the K-th memory banks includes a plurality of unit blocks. The K-th decoder converts the control signals to the K-th internal signals based on a K-th conversion relation in the normal operation mode, converts the test signals corresponding to the error test to the K-th internal signals based on the K-th conversion relation in the test mode and updates the K-th conversion relation based on a result of the test with respect to the K-th memory device.

The memory test system according to example embodiments may adjust the conversion relation of the decoder based on the result of the first test to reduce a time for the second test and prevent the repair resources from being exhausted for repairing the memory cells that are determined to be the failed memory cells due to a problem in the tester.

The memory system according to example embodiments, while it performs its own functions in the normal operation mode, may operate in the test mode to adjust the conversion relation of the decoder based on the result of the first test to reduce a time for the second test.

According to example embodiments, a memory system includes a tester and first and second memory devices. The tester is configured to generate test signals. Each of the first and second memory devices includes a decoder configured to convert a first test address of the test signals to a first internal address corresponding to a first test and convert the first test address to second internal address corresponding to a second test, wherein the second internal address is different from the first internal address, and a plurality of memory banks each including a plurality of memory cells, and configured to operate based on the first and second internal addresses. The first test address is converted to the second internal address based on a result of the first test.

According to example embodiments, a method of testing a memory device is provided. The method includes preparing a tester and n memory devices to be tested, n being a positive integer greater than 1, transferring test signals from the tester to the n memory devices, performing a first test by converting first test signals of the test signals to a first set of corresponding internal signals for each of the n memory devices, and performing a second test by converting the first test signals to a second set of corresponding internal signals for each of the n memory devices based on a result of the first test. The second set of internal signals for a first memory device of the n memory devices is different from the second set of internal signals for a second memory device of the n memory devices.

BRIEF DESCRIPTION OF THE DRAWINGS

Example embodiments of the present disclosure will be more clearly understood from the following detailed description taken in conjunction with the accompanying drawings.

FIG. 6 is a diagram illustrating an example result of the first test with respect to the memory test system of FIG. 1 according to example embodiments.

FIG. 7 is a diagram illustrating updating conversion relations of an address signal of decoders included in the memory test system of FIG. 1 according to example embodiments.

FIG. 8 is a diagram illustrating an example result of a second test with respect to the memory test system of FIG. 1 according to example embodiments.

FIG. 12 is a diagram illustrating an example result of the first test with respect to the memory test system of FIG. 1 according to example embodiments.

FIG. 13 is a diagram illustrating updating conversion relations of a command signal of decoders included in the memory test system of FIG. 1 according to example embodiments.

DETAILED DESCRIPTION OF THE EMBODIMENTS

Figure 1:
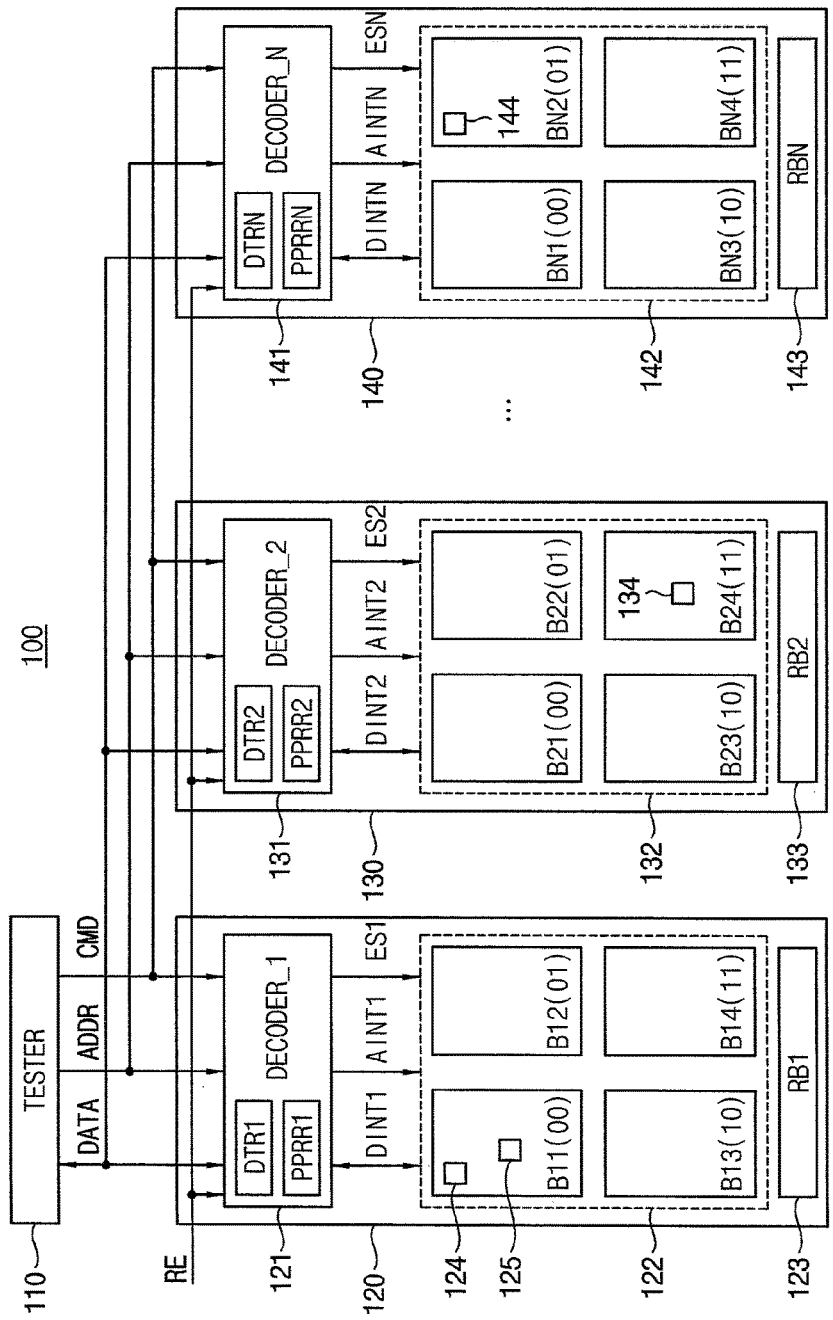
FIG. 1 is a block diagram illustrating a memory test system according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory test system according to example embodiments.

Referring to FIG. 1, a memory test system 100 may include a tester 110 and first through N-th memory devices 120, 130 and 140 where N is a positive integer greater than 1. The first memory device 120 may include a first bank 122 having a plurality of first memory banks B11, B12, B13 and B14 and a first decoder 121. The second memory device 130 may include a second bank 132 having a plurality of second memory banks B21, B22, B23 and B24 and a second decoder 131. The N-th memory device 140 may include an N-th bank 142 having a plurality of N-th memory banks BN1, BN2, BN3 and BN4 and an N-th decoder 141.

Each of the memory banks B11, B12, B13, B14, B21, B22, B23, B24, BN1, BN2, BN3 and BN4 may include a plurality of unit blocks. Each of the unit blocks may include a plurality of memory cells. For example, in certain embodiments, one unit block can be a page, or a plurality of memory cells connected to a word line. As an example, FIG. 1 illustrates a first unit block 124 and a second unit block 125 in the (1,1) memory bank B11, a third unit block 134 in the (2,4) memory bank B24 and a fourth unit block 144 in the (N,2) memory bank BN2. Here, the (K,L) memory bank BKL indicates the L-th memory bank of the K-th memory device, where L is a positive integer equal to or smaller than 4 and K is a positive integer equal to or smaller than N. Although FIG. 1 illustrates the four memory banks in each memory device, the number of the memory banks in each memory device may be changed variously.

First memory banks (e.g., B11, B21, and BN1) may be at first locations within their respective banks 122, 132, and 142, and may be at first locations within memory devices 120, 130, and 140. These first locations may be the same relative locations for each memory bank with respect to its corresponding bank or memory device. Similarly, second memory banks (e.g., B12, B22, and BN2) may be at second locations within their respective banks 122, 132, and 142, and may be at second locations within memory devices 120, 130, and 140. These second locations may be the same relative locations for each memory bank with respect to its corresponding bank or memory device, and may be different relative locations from the first locations. The same may apply for third memory banks (e.g., B13, B23, and BN3), and fourth memory banks (e.g., B14, B24, and BN4).

In addition, the unit blocks (e.g., 124, 134, and 144) of the memory banks B11, B24 and BN2 may be located at different relative locations with respect to the memory devices 120, 130, and 140 or banks 122, 132, and 142, and may be located at different relative memory banks with respect to the memory devices 120, 130, and 140.

The first decoder 121 may include a first error register DTR1 and a first repair register PPRR1. The second decoder 131 may include a second error register DTR2 and a second repair register PPRR2. The N-th decoder 141 may include an N-th error register DTR3 and an N-th repair register PPRR3. The configuration of the decoders 121, 131 and 141 will be further described below with reference to FIG. 5.

In some example embodiments, the first memory device 120 may further include a first repair memory block RB1 123, the second memory device 130 may further include a second repair memory block RB2 133 and the N-th memory device 140 may further include an N-th repair memory block RBN.

The tester 110 may generate test signals for testing the memory devices 120, 130 and 140, and the decoders 121, 131 and 141 may convert the test signals to first through N-th internal signals, respectively. The test signals may include an address signal ADDR, a data signal DATA and a command signal CMD. The first internal signals may include a first internal address signal AINT1, a first internal data signal DINT1 and a first bank enable signal ES1. The second internal signals may include a second internal address signal AINT2, a second internal data signal DINT2 and a second bank enable signal ES2. The N-th internal signals may include an N-th internal address signal AINTN, an N-th internal data signal DINTN and an N-th bank enable signal ESN.

The tester 110 may generate the test signals corresponding to a first test. The first test may be a test for verifying functions of the memory cells in the first bank 122, the second bank 132 and the N-th bank 142. In some example embodiments, the first test may be a test for verifying a write operation of the memory cells in the first bank 122, the second bank 132 and the N-th bank 142. In other example embodiments, the first test may be a test for verifying a read operation of the memory cells in the first bank 122, the second bank 132 and the N-th bank 142. In still other example embodiments, the first test may be a test for verifying a refresh operation of the memory cells in the first bank 122, the second bank 132 and the N-th bank 142. Also the first may be a test other than the write operation, the read operation and the refresh operation.

The first decoder 121 may convert the test signals DATA, ADDR and CMD corresponding to the first test to the first internal signals DINT1, AINT1 and ES1 based on a first conversion relation. The first bank 122 may operate based on the first internal signals DINT1, AINT1 and ES1. The second decoder 131 may convert the test signals DATA, ADDR and CMD corresponding to the first test to the second internal signals DINT2, AINT2 and ES2 based on a second conversion relation. The second memory banks 132 may operate based on the second internal signals DINT2, AINT2 and ES2. The N-th decoder 141 may convert the test signals DATA, ADDR and CMD corresponding to the first test to the N-th internal signals DINT2, AINT2 and ES2 based on an N-th conversion relation. The N-th memory banks 142 may operate based on the N-th internal signals DINTN, AINTN and ESN.

After performing the first test, results of the first test with respect to the first through N-th memory devices may be stored in the registers DTR1, PPRR1, DTR2, PPRR2, DTR4 and PPRR3, respectively. The first through N-th decoders 121, 131 and 141 may update the first through N-th conversion relations based on results of the first test that are stored in the registers DTR1, PPRR1, DTR2, PPRR2, DTR4 and PPRR3. In some example embodiments, the first through N-th decoders 121, 131 and 141 may update the first through N-th conversion relations respectively such that a second test may be performed in parallel, based on the first through N-th updated conversion relations, with respect to the memory banks that are determined through the first test to have errors (e.g., having failed memory cells). Thus, the update process of the first through N-th conversion relations will be further described below with reference to FIG. 7.

In some example embodiments, the first decoder 121 may update the first conversion relation when an update enable signal RE is activated and may initialize the first conversion relation when the update enable signal RE is deactivated. The second decoder 131 may update the second conversion relation when the update enable signal RE is activated and may initialize the second conversion relation when the update enable signal RE is deactivated. The N-th decoder 141 may update the N-th conversion relation when the update enable signal RE is activated and may initialize the N-th conversion relation when the update enable signal RE is deactivated.

The tester 110 may generate the test signals DATA, ADDR and CMD corresponding to a second test after the first test is finished. The first through N-th memory devices 120, 130 and 140 may perform the second test based on the first through N-th updated conversion relations, which are stored in the registers DTR1, PPRR1, DTR2, PPRR2, DTR4 and PPRR3, respectively. For example, the first through N-th decoders 121, 131 and 141 may convert the test signals DATA, ADDR and CMD corresponding to the second test to the first through N-th internal signals based on the first through N-th updated conversion relations, respectively.

The second test may be an additional test with respect to a unit block including a number of failed memory cells equal to or greater than a reference number. The reference number may be a maximum number of permitted failed memory cells of a memory device in order for the memory device to still be considered a good memory device. When the first test is a write test, the second test may be another write test under conditions stricter than the first test. When the first test is a read test, the second test may be another read test under conditions stricter than the first test (e.g., low power voltage, low timing margin, high frequency, and so on). When the first test is a refresh test, the second test may be another refresh test under conditions stricter than the first test.

Figure 2:
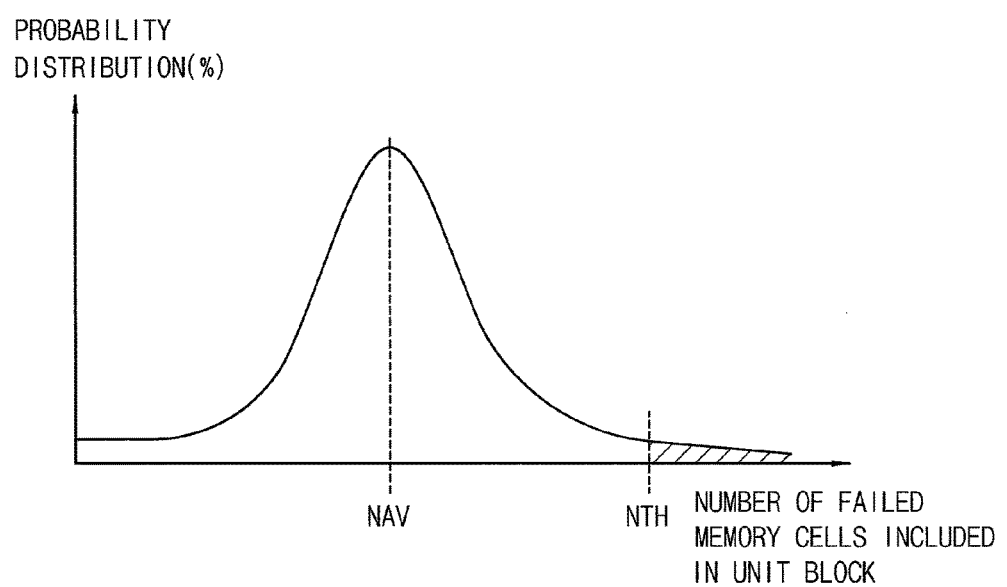
FIG. 2 is a diagram illustrating an error distribution of a unit block of a memory device.

FIG. 2 is a diagram illustrating an error distribution of a unit block of a memory device.

In FIG. 2, the horizontal reference axis represents the number of failed memory cells in each unit block and the vertical reference axis represents the probability distribution. The unit blocks 124, 125, 134 and 144 illustrated in FIG. 1 may include the failed memory cells that cannot function normally. The number of the failed memory cells in each unit block may have a normal distribution centered on the average number NAV.

The failed memory cells in the unit blocks of the first bank 122 may be replaced and repaired by repair memory cells in the first repair memory block 123. The failed memory cells in the unit blocks of the second bank 132 may be replaced and repaired by the repair memory cells in the second repair memory block 133. The failed memory cells in the unit blocks of the N-th bank 142 may be replaced and repaired by the repair memory cells in the N-th repair memory block 143.

When the number of the failed memory cells in the unit block exceeds a reference number NTH, the memory cells that are determined to be normal through the first test may cause errors in other tests because some memory cells are adjacent to the failed memory cells. In this case, the second test under the stricter conditions may be performed.

Figure 3:
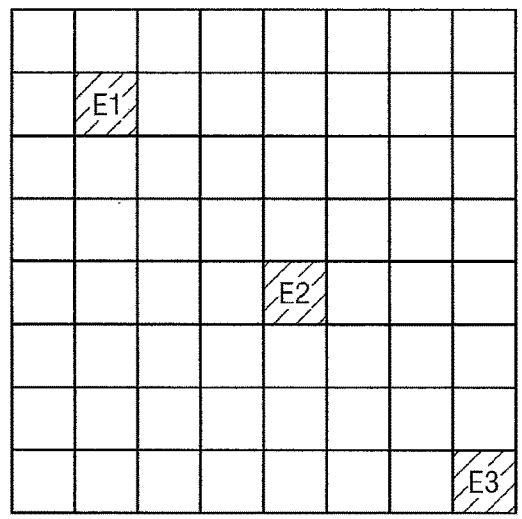
FIG. 3 is a diagram illustrating a unit block that is determined to be a normal unit block by a first test.
Figure 4:
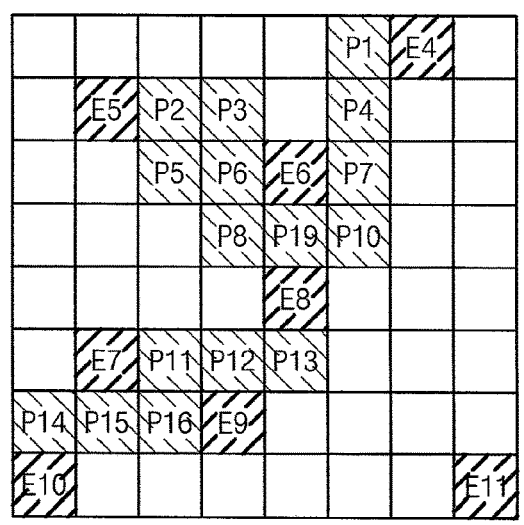
FIG. 4 is a diagram illustrating a unit block that is determined to be a failed unit block by the first test.

FIG. 3 is a diagram illustrating a unit block that is determined to be a normal unit block by a first test, and FIG. 4 is a diagram illustrating a unit block that is determined to be a failed unit block by the first test. FIGS. 3 and 4 illustrate an example where each unit block in the banks 122, 132 and 142 in FIG. 1 includes 8*8 memory cells, but the number and the arrangement of the memory cells in each unit block may be changed variously. The reference number NTH for determining the failed unit block is assumed to be five in FIGS. 3 and 4, but the reference number NTH may be changed variously.

Referring to FIG. 3, the first unit block 124 may be determined to a normal unit block through the first test because the number of the failed memory cells E1, E2 and E3 in the first unit block 124 is smaller than the reference number NTH. Referring to FIG. 4, the second unit block 125 may be determined to a failed unit block through the first test because the number of the failed memory cells E4~E11 in the second unit block 125 is greater than the reference number NTH. The memory cells P1~P16 that are determined to be normal through the first test may cause errors in other tests because the memory cells P1~P16 are between the error memory cells E4~E11. In this case, the second unit block 125 may be verified by the second test under the stricter conditions.

Figure 5:
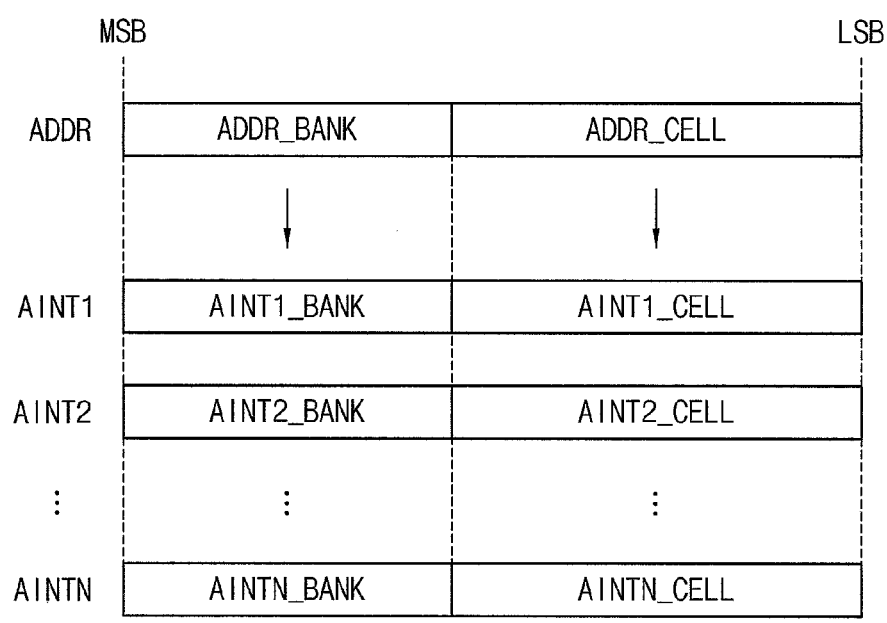
FIG. 5 is a diagram illustrating initial conversion relations of an address signal of decoders included in the memory test system of FIG. 1 according to example embodiments.

FIG. 5 is a diagram illustrating initial conversion relations of an address signal of decoders included in the memory test system of FIG. 1 according to example embodiments.

Referring to FIG. 5, the address signal ADDR may include a bank address signal ADDR_BANK near a most significant bit MSB and a cell address signal ADDR_CELL near a least significant bit LSB.

The first decoder 121 may output the bank address signal ADDR_BANK as a first internal bank address signal AINT1_BANK and may output the cell address signal ADDR_CELL as a first internal cell address signal AINT1_CELL based on the first initial conversion relation. The second decoder 131 may output the bank address signal ADDR_BANK as a second internal bank address signal AINT2_BANK and may output the cell address signal ADDR_CELL as a second internal cell address signal AINT2_CELL based on the second initial conversion relation. The N-th decoder 141 may output the bank address signal ADDR_BANK as an N-th internal bank address signal AINTN_BANK and may output the cell address signal ADDR_CELL as an N-th internal cell address signal AINTN_CELL based on the N-th initial conversion relation. For example, in some embodiments, the initial conversion relations represent no conversion and thus the test signals may be provided as the respective internal signals without conversion.

FIG. 6 is a diagram illustrating an example result of the first test with respect to the memory test system of FIG. 1 according to example embodiments.

The first through N-th decoders 121, 131 and 141 may operate as illustrated in FIG. 5 based on the initial conversion relations. For example, all of the first error register DTR1, the second error register DTR2 and the N-th error register DTRN may be initialized to "0000", which may represent the initial conversion relations. For example, as illustrated in FIG. 6, the (1,1) memory bank B11, the (2,4) memory bank B24 and the (N,2) memory bank BN2 in FIG. 1 may be determined through the first test to include failed memory cells, and the other memory banks B12, B13, B14, B21, B22, B23, BN1, BN3 and BN4 may be determined through the first test to be normal.

The result of the first test may include first through N-th sub-test results. The first through N-th sub-test results may be stored in the first through N-th error registers DTR1 through DTRN, respectively. In some example embodiments, at least one bit of the K-th (K is any positive integer equal to or smaller than N) sub-test result may have a logic high value (e.g., "1") when the K-th memory banks include a failed unit block, and all bits of the K-th sub-test result may have a logic low value (e.g., "0") when the K-th memory banks do not include a failed unit block, as illustrated in FIG. 6. In other example embodiments, at least one bit of the K-th sub-test result may have a logic low value (e.g., "0") when the K-th memory banks include a failed unit block, and all bits of the K-th sub-test result may have a logic high value (e.g., "1") when the K-th memory banks do not include a failed unit block As an example of the result of the first test, the first sub-test result may be stored in the first error register DTR1 as "0001", the second sub-test result may be stored in the second error register DTR2 as "1000" and the N-th sub-test result may be stored in the N-th error register DTRN as "0010", as illustrated in FIG. 6. The test result may be changed variously and the values different from those in FIG. 6 may be stored in the error registers DTR1 through DTRN.

If there is no update of the conversion relations of the decoders 121, 131 and 141 according to example embodiments, the tester 110 may have to provide "00", "01" and "11" three times sequentially as the bank address signal ADDR_BANK to perform three test routines TA, TB and TC. Thus the time for the second test, that is, the additional test may be increased.

FIG. 7 is a diagram illustrating updating conversion relations of an address signal of decoders included in the memory test system of FIG. 1 according to example embodiments.

Referring to FIG. 7, a first case CASE1 represents that all bits of the first through N-th sub-test results have the logic low value of "0". In the first case CASE1, for example, the K-th decoder maintains the K-th conversion relation without update such that a test address signal in the test signals is output as a K-th internal address signal of the K-th internal signals. For example, the first decoder 121 may maintain the first conversion relation to output the bank address signal ADDR_BANK as the first internal bank address signal AINT1_BANK, the second decoder 131 may maintain the second conversion relation to output the bank address signal ADDR_BANK as the second internal bank address signal AINT2_BANK, and the N-th decoder 141 may maintain the N-th conversion relation to output the bank address signal ADDR_BANK as the N-th internal bank address signal AINTN_BANK. The error registers DTR1 through DTRN may maintain the initial values "0000".

When at least two of the first through N-th sub-test results include at least one bit of the logic high value of "1", for example, the K-th decoder may adjust or update the K-th conversion relation between the address signal ADDR and the K-th internal address signal AINTK such that the second test may be performed in parallel, based on the first through N-th updated conversion relations, with respect to the memory banks including the failed unit block and included in the different memory devices.

For example, a second case CASE2 in FIG. 7 represents that the first through N-th sub-test results of "0001", "1000" and "0010" are stored in the error registers DTR1, DTR2, and DTRN, respectively. In the second case CASE2, the second decoder 131 may adjust the first conversion relation such that the second decoder 131 may convert "00" of the bank address signal ADDR_BANK to "11" of the second internal bank address signal AINT2_BANK and convert "11" of the bank address signal ADDR_BANK to "00" of the second internal bank address signal AINT2_BANK. Also the N-th second decoder 141 may adjust the N-th conversion relation such that the N-th decoder 141 may convert "00" of the bank address signal ADDR_BANK to "01" of the N-th internal bank address signal AINTN_BANK and convert "01" of the bank address signal ADDR_BANK to "00" of the N-th internal bank address signal AINTN_BANK. Through the update conversion relations between the bank address signal ADDR_BANK and the internal bank address signals AINT1_BANK through AINTN_BANK, the second test may be performed simultaneously or in parallel with respect to the memory banks B11, B24 and BN2 including the failed unit blocks 124, 125, 134 and 144 as illustrated in FIG. 1. Thus, the failed unit blocks of the memory banks B11, B24 and BN2 may be simultaneously selected even though the failed unit blocks of the memory banks B11, B24 and BN2 are located at different relative locations with respect to the memory devices 120, 130, and 140 in FIG. 1.

As such, the first through N-th decoders 121, 131 and 141 in the memory test system of FIG. 1 may update the first through N-th conversion relations such that the second test may be performed in parallel, based on the first through N-th updated conversion relations, with respect to the memory banks including the failed unit block and included in the different memory devices. The second case CASE2 illustrated in FIG. 7 is a non-limiting example for describing the example embodiments, and the update of the conversion relations may be performed variously.

FIG. 8 is a diagram illustrating an example result of a second test with respect to the memory test system of FIG. 1 according to example embodiments.

Referring to FIG. 8, based on the updated conversion relations of the second case CASE2 in FIG. 7, the tester 110 may provide "00" as the bank address signal ADDR_BANK to perform one test routine TD for testing the memory banks in the different memory devices simultaneously. Thus the time for the second test, that is, the additional test may be reduced.

Figure 9:
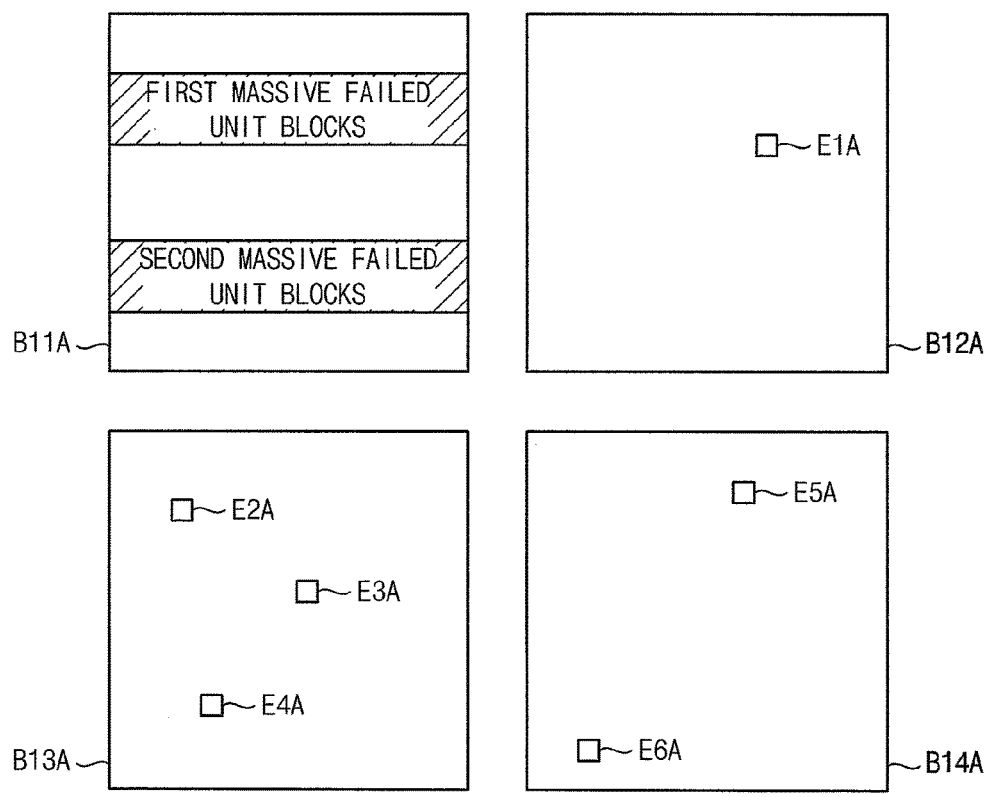
FIGS. 9, 10 and 11 are diagrams illustrating memory banks included in the memory test system of FIG. 1 according to example embodiments.
Figure 10:
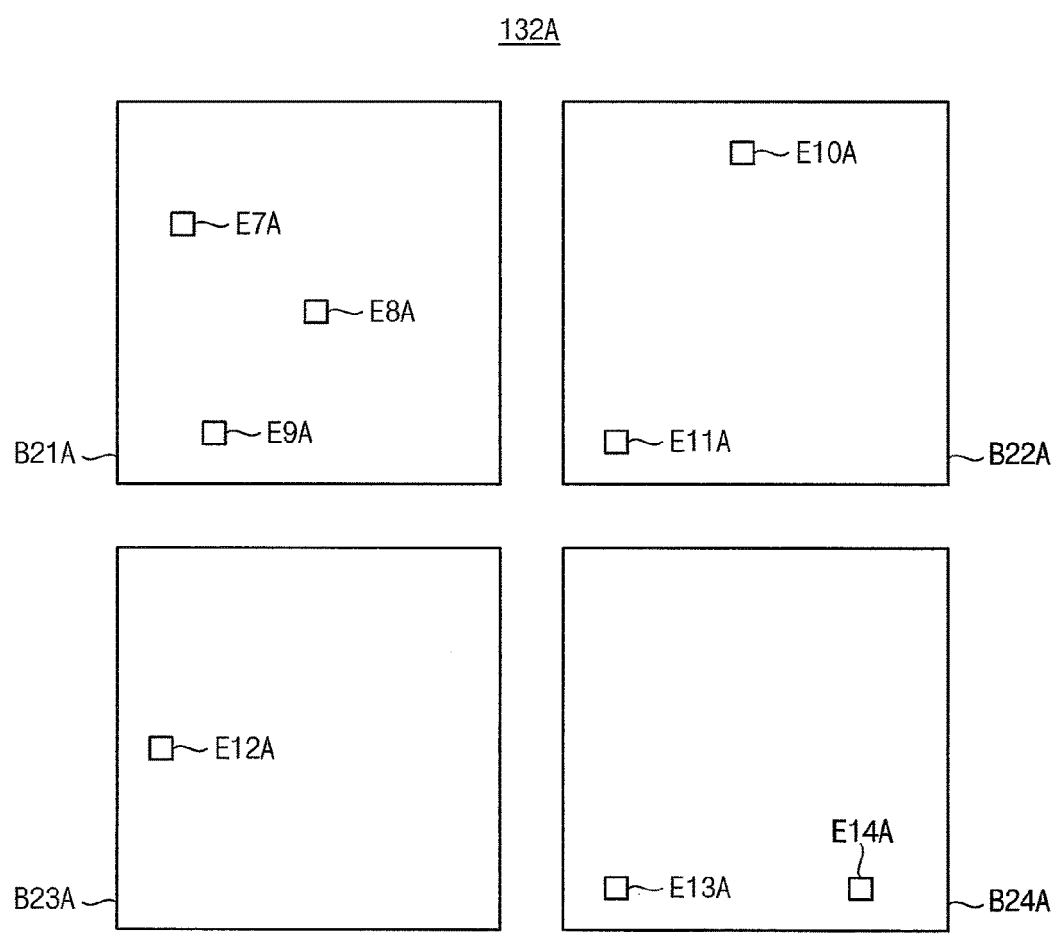
Figure 11:
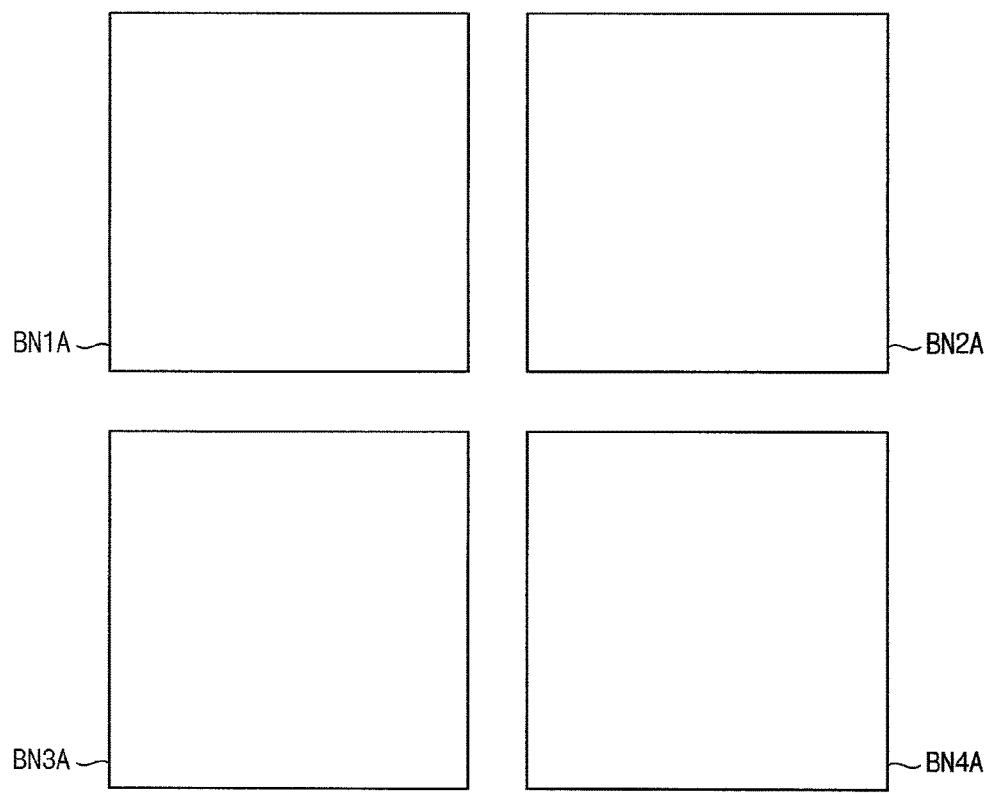

FIGS. 9, 10 and 11 are diagrams illustrating memory banks included in the memory test system of FIG. 1 according to example embodiments.

FIG. 9 illustrates an example of the first bank 122A such that the (1,1) memory bank B11A includes first massive failed unit blocks and a second massive failed unit blocks, the (1, 2) memory bank B12A includes a first failed unit block E1A, the (1,3) memory bank B13A includes second, third and fourth failed unit blocks E2A, E3A and E4A, and the (1,4) memory bank B14A includes fifth and sixth failed unit blocks E5A and E6A.

FIG. 10 illustrates an example of the second bank 132A that the (2,1) memory bank B21A includes seventh, eighth and ninth failed unit blocks E7A, E8A and E9A, the (2, 2) memory bank B22A includes tenth and eleventh failed unit blocks E10A and E11A, the (2,3) memory bank B23A includes a twelfth failed unit block E12A, and the (2,4) memory bank B24A includes thirteenth and fourteenth failed unit blocks E13A and E14A FIG. 11 illustrates an example of the N-th bank 142A that all of the memory banks BN1A, BN2A, BN3A and BN4A include no failed unit block.

It may be understood that the failed unit blocks E7A~E14A have been detected actually with respect to the memory banks B12A, B13A, B14A, B21A, B22A, B23A, B24A, BN1, BN2, BN3 and BN4. In this case, the failed unit blocks E7A~E14A may be replaced and repaired by the repair memory blocks 123, 133 and 143 to restore the function of the memory banks B12A, B13A, B14A, B21A, B22A, B23A, B24A, BN1, BN2, BN3 and BN4.

In contrast, it may be understood that the tester 110 has a problem and thus such massive failed unit blocks may be included in the (1,1) memory bank B11A. If the first and second massive failed unit blocks are repaired using the first repair memory block 123, the repair resources are exhausted and thus the failed unit blocks E1A~E6A cannot be repaired.

FIG. 12 is a diagram illustrating an example result of the first test with respect to the memory test system of FIG. 1 according to example embodiments.

Referring to FIG. 12, the result of the first test may include first through N-th sub-test results. In some example embodiments, the K-th (K is any positive integer equal to or smaller than N) sub-test result may have a logic high value (e.g., "1") when the number of the failed unit blocks in the K-th memory banks is equal to or greater than a threshold number NLIMIT, and the K-th sub-test result has a logic low value (e.g., "0") when the number of the failed unit blocks in the K-th memory banks is smaller than the threshold number NLIMIT, as illustrated in FIG. 12. The first through n-th sub-test results may be set or stored in the repair registers PPRR1 through PPRRN, respectively. In other example embodiments, the K-th sub-test result may have a logic low value (e.g., "0") when the number of the failed unit blocks in the K-th memory banks is equal to or greater than a threshold number NLIMIT, and the K-th sub-test result has a logic high value (e.g., "1") when the number of the failed unit blocks in the K-th memory banks is smaller than the threshold number NLIMIT, As illustrated in FIG. 12, since the number "200" of the failed unit blocks in the first bank 122A of FIG. 9 exceeds the threshold number NLIMIT of "100", the first sub-test result has a value of "1" and the first repair register PPRR1 may be set to have "1". Since the number "8" of the failed unit blocks in the second memory banks 132A of FIG. 10 does not exceed the threshold number NLIMIT of "100", the second sub-test result has a value of "0" and the second repair register PPRR2 may be set to have "0". Since the number "0" of the failed unit blocks in the N-th memory banks 142A of FIG. 11 does not exceed the threshold number NLIMIT of "100", the N-th sub-test result has a value of "0" and the N-th repair register PPRRN may be set to have "0".

FIG. 13 is a diagram illustrating update conversion relations of a command signal of decoders included in the memory test system of FIG. 1 according to example embodiments.

Referring to FIG. 13, for example, when the K-th sub-test result has the logic low value of "0" that is stored in the K-th repair register PPRRK, the K-th memory device may adjust the K-th conversion relation such that a K-th bank enable signal ESK included in the K-th internal signals may be activated based on a repair command signal PPR include in the test signals. For example, the K-th bank enable signal ESK may be activated to have the logic high value of "1" in response to the repair command signal PPR. In this case, the K-th memory device may repair failed unit blocks in the K-th memory banks by replacing the failed unit blocks with the K-th repair memory block. The second bank 132A of FIG. 10 and the N-th bank 142A of FIG. 11 correspond to this case.

When the K-th sub-test result has the logic high value of "1" that is stored in the K-th repair register PPRRK, the K-th memory device may adjust the K-th conversion relation such that the K-th bank enable signal ESK may be deactivated regardless of the repair command signal PPR. For example, the K-th bank enable signal ESK may be deactivated to have the logic low value of "0" even though the repair command signal PPR is received from the tester 110. In this case, the K-th memory device may not repair the failed unit blocks in the K-th memory banks. The first bank 122A of FIG. 9 corresponds to this case. In this case, the test and the repair process may be performed after the tester 110 is verified and fixed to operate normally.

Figure 14:
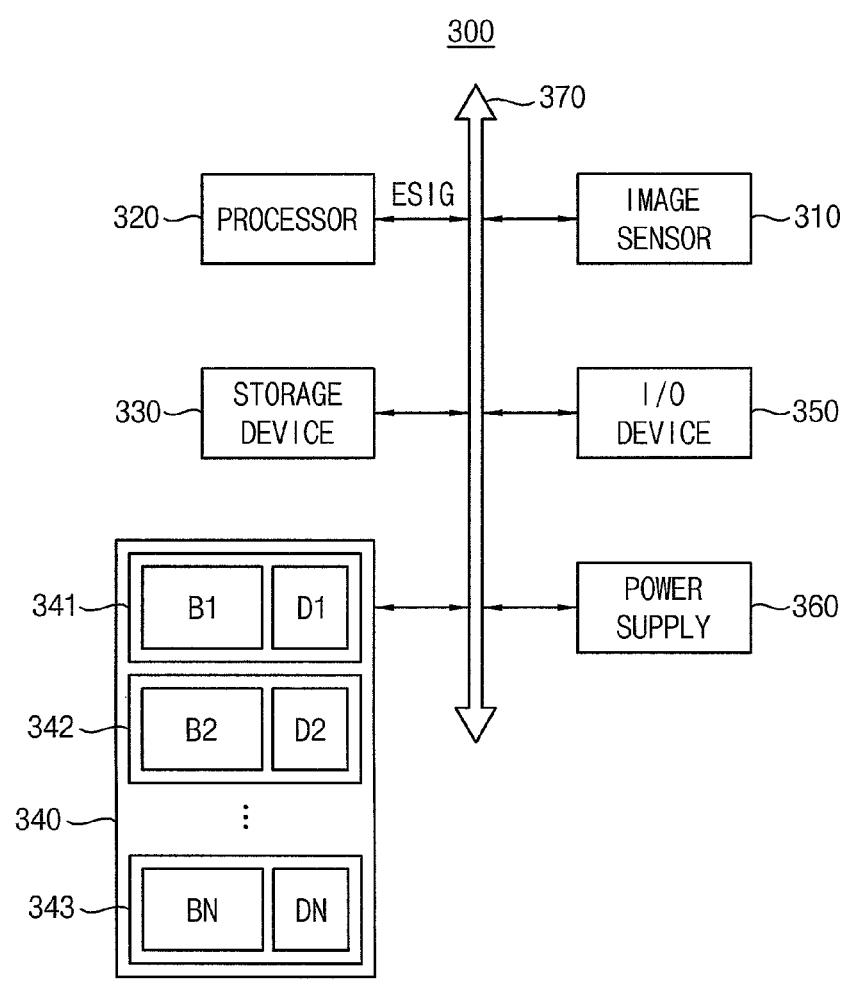
FIG. 14 is a block diagram illustrating a memory system according to example embodiments.

FIG. 14 is a block diagram illustrating a memory system according to example embodiments.

Referring to FIG. 14, a memory system 300 may include an image sensor 310, a processor 320, a storage device 330, a memory module 340, an input/output device 350 and a power supply 360. Although it is not illustrated in FIG. 14, the memory system 300 may further include ports that communicate with a video card, a sound card, a memory card, a universal serial bus (USB) device, and/or other electronic devices.

The processor 320 may perform various calculations or tasks. The processor 320 may be a microprocessor or a central processing unit (CPU). The processor 320 may communicate with the storage device 330, the memory module 340 and the input/output device 350 via an address bus, a control bus, and/or a data bus. In some example embodiments, the processor 320 may be coupled to an extended bus, such as a peripheral component interconnection (PCI) bus.

The processor 320 may generate control signals in a normal operation mode to control the memory device 340 as well known in the art. Also the processor may generate test signals ESIG in a test mode for testing the memory device 340.

The memory module 340 may include first through N-th (N is a positive integer greater than 1) memory devices 341, 342 and 343. The first memory device 341 may include a first memory bank B1 and a first decoder D1. The second memory device 342 may include a second memory bank B2 and a second decoder D2. The N-th memory device 343 may include N-th memory banks BN and an N-th decoder DN. Each of the memory devices 341, 342, and 343 may correspond to each of the memory devices 120, 130, and 140 in FIG. 1.

For example, each of the K-th (K is any positive integer equal to or smaller than N) memory banks may operate based on K-th internal signals, and each of the K-th memory banks may include a plurality of unit blocks. The K-th decoder may convert the control signals to the K-th internal signals based on a K-th conversion relation in the normal operation mode. The K-th decoder may convert the test signals ESIG corresponding to a test to the K-th internal signals based on the K-th conversion relation. The K-th decoder may update the K-th conversion relation based on a result of the test with respect to the K-th memory device.

The detailed descriptions are omitted because the operations of the memory module 340 may be understood as described with reference to FIGS. 1 through 13.

The memory module 340 may store data for operating the memory system 300. For example, each of the memory devices 341, 342, and 343 may be implemented using a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device 330 may include a solid state drive (SSD), a hard disk drive (HDD), a compact-disc read-only memory (CD-ROM), etc. The input/output device 350 may include an input device (e.g., a keyboard, a keypad, a mouse, etc.) and an output device (e.g., a printer, a display device, etc.). The power supply 1050 supplies operation voltages for the computing system 1000.

The image sensor 310 may communicate with the processor 320 via the buses or other communication links. The image sensor 310 may be integrated with the processor 320 in one chip, or the image sensor 310 and the processor 320 may be implemented as separate chips.

The memory system 300 may be packaged according to any one or more of a large variety of packaging technologies, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), or wafer-level processed stack package (WSP).

The memory system 300 may be any of a variety of systems including a memory device. For example, the computing system 1000 may include a digital camera, a mobile phone, a smart phone, a portable multimedia player (PMP), a personal digital assistant (PDA), etc.

Figure 15:
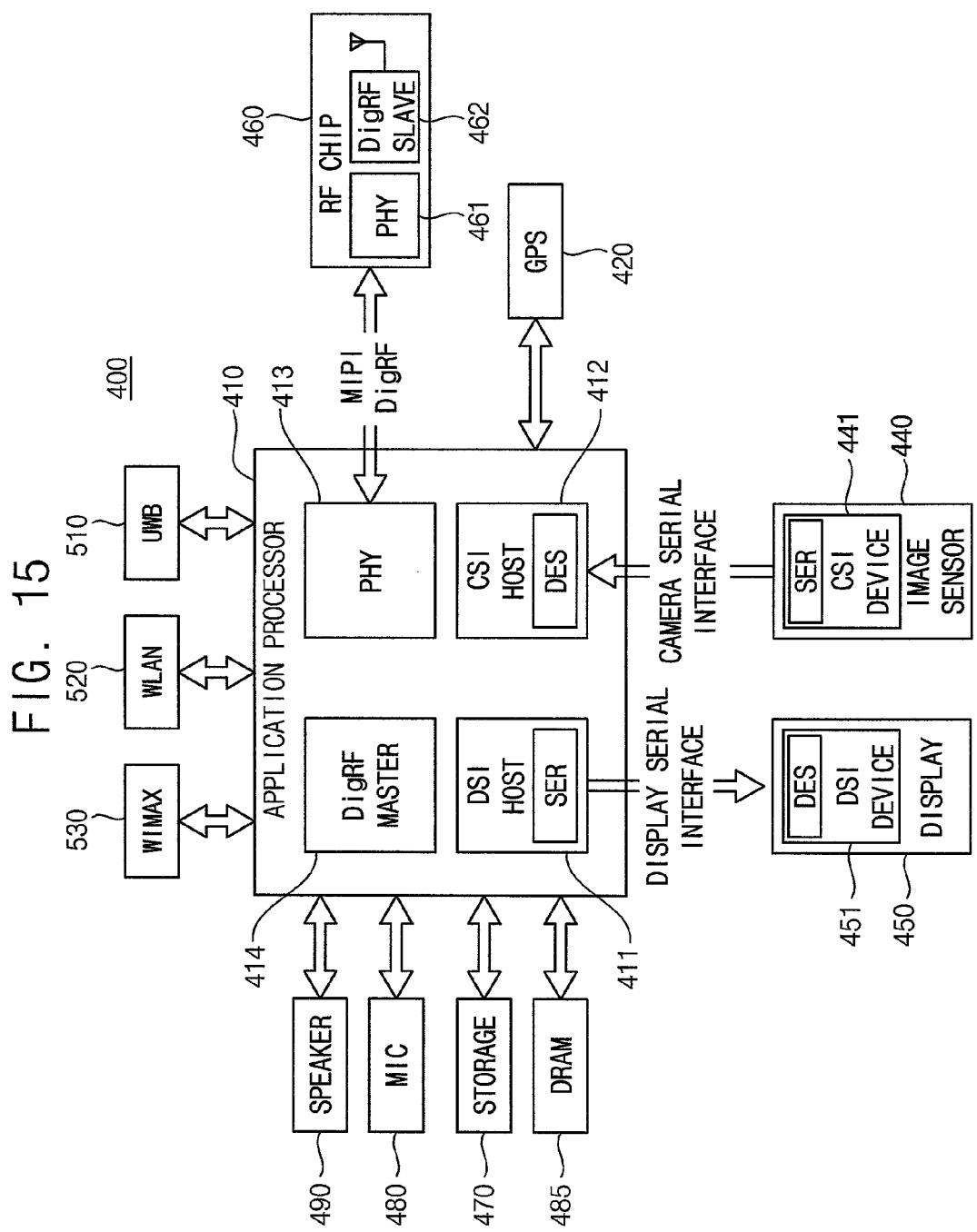
FIGS. 15 and 16 are block diagrams illustrating a computing system according to example embodiments.
Figure 16:
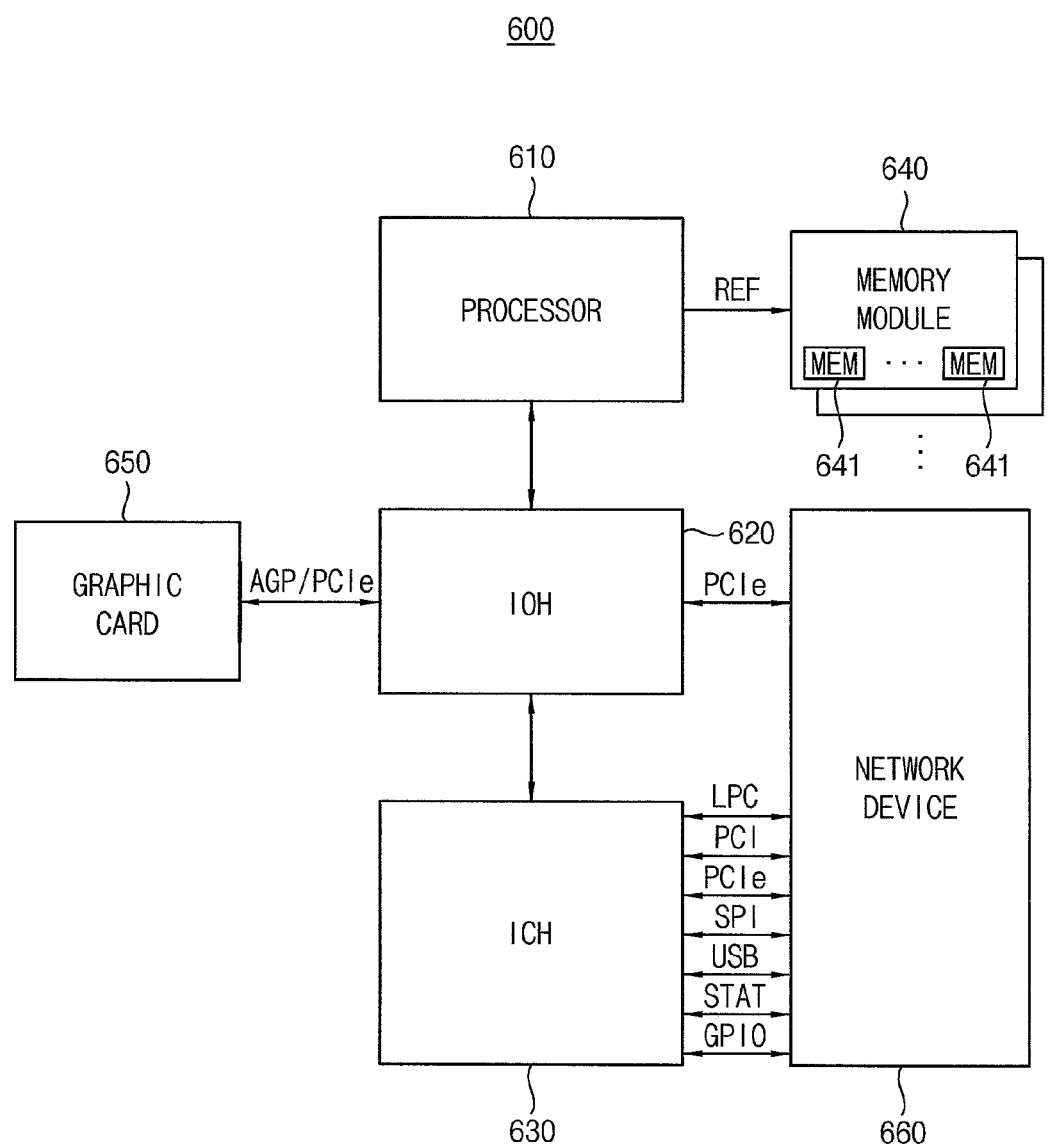

FIGS. 15 and 16 are block diagrams illustrating a computing system according to example embodiments.

Referring to FIG. 15, a computing system 400 may be implemented by a data processing device that uses or supports a mobile industry processor interface (MIPI®) interface. The computing system 400 may include an application processor 410, an image sensor 440, a display device 450, etc.

A CSI host 412 of the application processor 410 may perform serial communication with a CSI device 441 of the image sensor 440 via a camera serial interface (CSI). In some example embodiments, the CSI host 412 may include a deserializer (DES), and the CSI device 441 may include a serializer (SER). A DSI host 411 of the application processor 410 may perform serial communication with a DSI device 451 of the display device 450 via a display serial interface (DSI). In some example embodiments, the DSI host 411 may include a serializer (SER), and the DSI device 451 may include a deserializer (DES).

The computing system 400 may further include a radio frequency (RF) chip 460 performing a communication with the application processor 410. A physical layer (PHY) 413 of the application processor 410 and a physical layer (PHY) 461 of the RF chip 460 may perform data communications based on a MIPI® DigRFSM. The application processor 410 may further include a DigRFSM MASTER 414 and the RF chip 460 may further include a DigRF SLAVE 462 that is controlled by the DigRFSM MASTER 414.

The computing system 400 may further include a global positioning system (GPS) 420, a storage 470, a MIC 480, a DRAM device 485, and a speaker 490. In addition, the computing system 400 may perform communication using an ultra-wideband (UWB) 510, a wireless local area network (WLAN) 520, a worldwide interoperability for microwave access (WIMAX) 530, etc. However, the structure and the interface of the computing system 400 are not limited thereto.

The application processor 410 may correspond to the processor 320 in FIG. 14 and the DRAM device 485 may correspond to each of the memory devices 341, 342, and 343 in FIG. 1.

Referring to FIG. 16, a computing system 600 includes a processor 610, an input/output hub (IOH) 620, an input/output controller hub (ICH) 630, at least one memory module 640, and a graphics card 650 and a network device 660. In some embodiments, the computing system 600 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 610 may perform various computing functions such as executing specific software for performing specific calculations or tasks. For example, the processor 610 may be a microprocessor, a central process unit (CPU), a digital signal processor, or the like. In some embodiments, the processor 610 may include a single core or multiple cores. For example, the processor 610 may be a multi-core processor, such as a dual-core processor, a quad-core processor, a hexa-core processor, etc. Although FIG. 16 illustrates the computing system 600 including one processor 610, in some embodiments, the computing system 600 may include a plurality of processors.

The processor 610 may include a memory controller for controlling operations of the memory module 640. The memory controller included in the processor 610 may be referred to as an integrated memory controller (IMC). A memory interface between the memory controller and the memory module 640 may be implemented with a single channel including a plurality of signal lines, or may bay be implemented with multiple channels, to each of which at least one memory module 640 may be coupled. In some embodiments, the memory controller may be located inside the input/output hub 620, which may be referred to as memory controller hub (MCH).

The processor 610 may correspond to the processor 320 in FIG. 14 and the memory module 640 may correspond to the memory module 340 in FIG. 14.

The memory module 640 may include a plurality of memory devices MEM 641 that store data provided from the memory controller. The memory device 641 may correspond to each of the memory devices 120, 130 and 140 in FIG. 1. The input/output hub 620 may manage data transfer between processor 610 and devices, such as the graphics card 650. The input/output hub 620 may be coupled to the processor 610 via various interfaces. For example, the interface between the processor 610 and the input/output hub 620 may be a front side bus (FSB), a system bus, a HyperTransport, a lightning data transport (LDT), a QuickPath interconnect (QPI), a common system interface (CSI), etc. Although FIG. 16 illustrates the computing system 600 including one input/output hub 620, in some embodiments, the computing system 600 may include a plurality of input/output hubs.

The graphic card 650 may be coupled to the input/output hub 620 via AGP or PCIe. The graphics card 650 may control a display device (not shown) for displaying an image. The graphics card 650 may include an internal processor for processing image data and an internal memory device. In some embodiments, the input/output hub 620 may include an internal graphics device along with or instead of the graphics card 650 outside the input/output hub 620. The graphics device included in the input/output hub 620 may be referred to as integrated graphics. Further, the input/output hub 620 including the internal memory controller and the internal graphics device may be referred to as a graphics and memory controller hub (GMCH).

The input/output controller hub 630 may perform data buffering and interface arbitration to efficiently operate various system interfaces. The input/output controller hub 630 may be coupled to the input/output hub 620 via an internal bus, such as a direct media interface (DMI), a hub interface, an enterprise Southbridge interface (ESI), PCIe, etc.

The input/output controller hub 630 may provide various interfaces with peripheral devices. For example, the input/output controller hub 630 may provide a universal serial bus (USB) port, a serial advanced technology attachment (SATA) port, a general purpose input/output (GPIO), a low pin count (LPC) bus, a serial peripheral interface (SPI), a peripheral component interface (PCI), a peripheral component interface-express (PCIe), etc.

The network device 660 may receive the information from the processor 610 and the graphics card 650 through the PCIe coupled to the input/output hub 620, or the USB, the SATA, the GPIO, the LPC, the SPI, the PCI or the PCIe coupled to the input/output controller hub 630, to provide the received information to other computing systems.

In some embodiments, the processor 610, the input/output hub 620 and the input/output controller hub 630 may be implemented as separate chipsets or separate integrated units. In other embodiments, at least two of the processor 610, the input/output hub 620 and the input/output controller hub 630 may be implemented as a single chipset. Also, while many features of the embodiments are disclosed as units, in other embodiments those features may be implemented as other forms of logic including but not limited to code-based operations performed by a processor.

Figure 17:
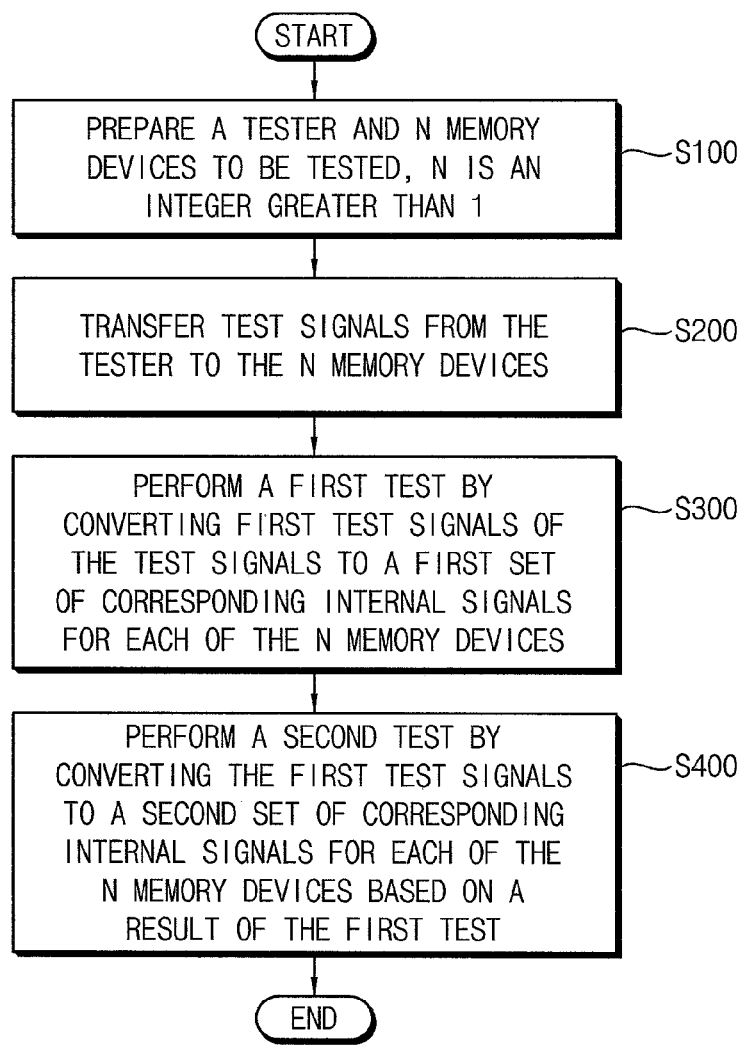
FIG. 17 is a flowchart illustrating a method of testing a memory device according to example embodiments.

FIG. 17 is a flowchart illustrating a method of testing a memory device according to example embodiments.

Referring to FIG. 17, a method of testing a memory device to be tested is provided. The method includes preparing a tester and n memory devices to be tested, n being a positive integer greater than 1 (S100); transferring test signals from the tester to the n memory devices (S200); performing a first test by converting first test signals of the test signals to a first set of corresponding internal signals for each of the n memory devices (S300); and performing a second test by converting the first test signals to a second set of corresponding internal signals for each of the n memory devices based on a result of the first test (S400). The second set of internal signals for a first memory device of the n memory devices (which may be "11" of the second internal bank address signal AINT2_BANK in some embodiments) may be different from the second set of internal signals for a second memory device of the n memory devices (which may be "01" of the N-th internal bank address signal AINTN_BANK in some embodiments), wherein the second set of internal signals are based on the first test signals of the tester (which may be "00" of the bank address signal ADDR_BANK in some embodiments). Thus, at least two failed unit blocks having different relative locations with respect to two different memory devices may be simultaneously selected when the tester transfers the first test signal (e.g., a bank address) so that a test time may be reduced.

The present disclosure may be applied to arbitrary devices and systems including a memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory test system comprising:
a tester configured to generate test signals; and
N memory devices, wherein a K-th memory device of the N memory devices comprises:
   a K-th decoder configured to, in a test mode, convert the test signals corresponding to a first test to first internal signals based on a K-th conversion relation, update the K-th conversion relation based on a result of the first test with respect to the K-th memory device, and convert the test signals corresponding to a second test to second internal signals based on the updated K-th conversion relation, where N is a positive integer greater than 1 and K is a positive integer equal to or smaller than N; and
   a plurality of K-th memory banks configured to, in a test mode, operate based on the first and second internal signals, each of the K-th memory banks including a plurality of unit blocks.

2. The memory test system of claim 1, wherein first through N-th decoders of the N memory devices update first through N-th conversion relations respectively such that the second test for the N memory devices is performed in parallel, based on the first through N-th reset conversion relations, with respect to the respective memory banks that are determined through the first test to have errors.

3. The memory test system of claim 1, wherein the tester is configured to generate the test signals corresponding to the second test after the first test is finished and the K-th memory device performs the second test based on the updated K-th conversion relation.

4. The memory test system of claim 3, wherein each unit block of each bank of the K-th memory banks includes a plurality of memory cells, and
wherein the second test is an additional test with respect to the each unit block including a greater number of failed memory cells than a reference number.

5. The memory test system of claim 1, wherein the K-th decoder includes a K-th register configured to store a K-th sub test result corresponding to the first test.

6. The memory test system of claim 1, wherein the K-th decoder updates the K-th conversion relation after the first test such that a bank enable signal of third internal signals by converting the test signals is deactivated when a repair command signal of the test signals is transferred to the K-th memory device that includes a number of failed unit blocks greater than a threshold number.

7. The memory test system of claim 1, wherein the K-th decoder updates the K-th conversion relation such that a K-th bank enable signal of the second internal signals is activated based on a repair command signal of the test signals, and the K-th memory device that includes a number of failed unit blocks in each of the K-th memory banks less than a threshold number and repairs the failed unit blocks.

8. A memory system comprising:
   a tester configured to generate test signals; and
   first and second memory devices each device comprising:
      a decoder configured to, in a test mode, convert a first test address of the test signals to a first internal address corresponding to a first test and convert the first test address to second internal address corresponding to a second test, wherein the second internal address is different from the first internal address; and
      a plurality of memory banks each including a plurality of memory cells, and configured to operate based on the first and second internal addresses in the test mode,
      wherein the first test address is converted to the second internal address based on a result of the first test.

9. The memory system of claim 8, wherein each of the first and second memory devices further includes a register configured to store a result of the corresponding first test.

10. The memory system of claim 8, wherein a corresponding decoder of the first and second memory devices is configured to convert the first test address to the second internal address when a unit block of at least one of the first and second memory devices includes a number of failed memory cells corresponding to the first test, and
   wherein the number of failed memory cells is equal to or greater than a reference number.

11. The memory system of claim 8, wherein, corresponding to the second test, a selected memory bank of the first memory device based on the first test address is located at a different relative location from a selected memory bank of the second memory device based on the first test address.

12. The memory system of claim 8, wherein a decoder of each of the first and second memory devices is configured to convert the first test address to the same first internal address corresponding to the first test.

13. The memory system of claim 8, wherein the decoder of each of the first and second memory devices is configured to convert the first test address to respective second internal addresses, and simultaneously select different relative unit blocks of the first and second memory devices based on the first test address.

14. The memory system of claim 8, wherein each of the first and second memory devices is configured to:
   repair failed first unit blocks of each of the memory banks based on a repair command received from the tester when a number of failed first unit blocks is less than a threshold number; and
   not repair failed second unit blocks based on the repair command when a number of failed second unit blocks is equal to or greater than the threshold number.

15. A method of testing a memory device, the method comprising:
   preparing a tester and n memory devices to be tested, n being a positive integer greater than 1;
   transferring test signals from the tester to the n memory devices;
   performing a first test by converting first test signals of the test signals to a first set of corresponding internal signals for each of the n memory devices; and
   performing a second test by converting the first test signals to a second set of corresponding internal signals for each of the n memory devices based on a result of the first test,
   wherein, the second set of corresponding internal signals for a first memory device of the n memory devices is different from the second set of corresponding internal signals for a second memory device of the n memory devices.

16. The method of claim 15, further comprising:
   for each of the n memory devices, storing a result of the corresponding first test in a register of that memory device.

17. The method of claim 15, wherein the first test signals for each of the n memory devices include a bank address signal.

18. The method of claim 15, wherein performing the second test occurs when a unit block of at least one of the n memory devices includes a number of failed memory cells equal to or greater than a reference number.

19. The method of claim 15, wherein performing the second test includes selecting simultaneously a first unit block of a first memory device and a second unit block of a second memory device based on a first address signal of the test signals, and
   wherein the first and second unit blocks have different relative locations with respect to the first and second memory devices in which they are included.

20. The method of claim 15, wherein performing the second test includes:
   performing a repair operation for a first memory device based on a repair command received from the tester when a number of failed unit blocks of the first memory device is less than a threshold number; and
   not performing a repair operation for a second memory device based on the repair command when a number of failed unit blocks of the second memory device is equal to or greater than the threshold number.

* * * * *